(12) United States Patent
Yang et al.

(10) Patent No.: US 10,378,743 B2
(45) Date of Patent: Aug. 13, 2019

(54) LED POWER SUPPLY

(71) Applicant: SHENZHEN LONGOOD INTELLIGENT ELECTRIC CO., LTD, Shenzhen (CN)

(72) Inventors: Xiong Yang, Shenzhen (CN); Zhigao Chen, Poyang Town (CN); Jun Ding, Chebu Town (CN); Qingsong Chu, Jinlan Town (CN); Yu Luo, Lianhe Village (CN)

(73) Assignee: SHENZHEN LONGOOD INTELLIGENT ELECTRIC CO., LTD, Shenzhen (CN)

( * ) Notice: Subject to any disclaimer, the term of this patent is extended or adjusted under 35 U.S.C. 154(b) by 19 days.

(21) Appl. No.: 15/740,342

(22) PCT Filed: Jul. 7, 2016

(86) PCT No.: PCT/CN2016/089249
§ 371 (c)(1),
(2) Date: Dec. 27, 2017

(87) PCT Pub. No.: WO2018/006382
PCT Pub. Date: Jan. 11, 2018

(65) Prior Publication Data
US 2018/0328577 A1    Nov. 15, 2018

(51) Int. Cl.
*F21V 23/02*    (2006.01)
*F21V 23/00*    (2015.01)
(Continued)

(52) U.S. Cl.
CPC .......... *F21V 23/023* (2013.01); *F21V 23/001* (2013.01); *F21V 23/007* (2013.01);
(Continued)

(58) Field of Classification Search
CPC ....................................................... F21V 23/02
(Continued)

(56) References Cited

U.S. PATENT DOCUMENTS 3,774,145 A * 11/1973 Vlahos ................ H01R 4/24
439/623
6,382,803 B1    5/2002 Arumugasaamy
(Continued)

FOREIGN PATENT DOCUMENTS

CN    201057682 Y    5/2008
CN    101415307 A    4/2009
(Continued)

OTHER PUBLICATIONS

International Search Report, PCT/CN2016/089249, Published Jul. 7, 2016, 4 pages.
(Continued)

*Primary Examiner* — Stanley Tso
(74) *Attorney, Agent, or Firm* — Franklin & Associates International Inc; Matthew Lambrinos (57) ABSTRACT

An LED power supply, comprising: a first housing, which has a box structure with an opening end; a second housing disposed on the opening end of first housing, partially covering the opening end; a partition plate disposed vertically on one end of the second housing, and the second housing, the partition plate, and part of the first housing cooperatively form an electric chamber; a cover body disposed on the opening end of first housing and covering the opening end together with the second housing, and the cover body, the partition plate and the remaining part of the first housing cooperatively form a wiring chamber; and a separating member disposed in the wiring chamber to divide the wiring chamber into a high voltage region and a low voltage region, and the high voltage region and the low voltage region are separated from each other via the separating member.

8 Claims, 8 Drawing Sheets

(51) Int. Cl.
*H05K 5/00* (2006.01)
*H05K 5/02* (2006.01)
*H05K 5/04* (2006.01)
*H05K 7/02* (2006.01)
*F21Y 115/10* (2016.01)
*H02G 3/08* (2006.01)

(52) U.S. Cl.
CPC ......... *H05K 5/0008* (2013.01); *H05K 5/0247* (2013.01); *H05K 5/04* (2013.01); *H05K 7/02* (2013.01); *F21Y 2115/10* (2016.08); *H02G 3/081* (2013.01); *H05K 5/0204* (2013.01)

(58) Field of Classification Search
USPC ........................................................ 174/520
See application file for complete search history.

(56) References Cited

U.S. PATENT DOCUMENTS

| | | | |
|---|---|---|---|
| 8,687,357 | B2 | 4/2014 | Nagano et al. |
| 9,671,091 | B2 | 6/2017 | Jones |
| 9,803,842 | B2 | 10/2017 | Yang et al. |
| 2008/0160826 | A1* | 7/2008 | Lamoureux ............ H01R 27/02 439/535 |
| 2011/0100669 | A1* | 5/2011 | Lee ........................ H02G 3/083 174/50 |
| 2015/0216065 | A1 | 7/2015 | Chai et al. |
| 2016/0230964 | A1 | 8/2016 | Boxler et al. |
| 2016/0327257 | A1* | 11/2016 | Li ........................ F21V 23/023 |
| 2017/0346440 | A1* | 11/2017 | Lester .................... H02S 40/34 |

FOREIGN PATENT DOCUMENTS

| | | |
|---|---|---|
| CN | 204829757 U | 12/2015 |
| CN | 205079196 U | 3/2016 |
| CN | 205883772 U | 1/2017 |
| JP | 2012155986 A | 8/2016 |
| WO | 2018006382 A1 | 1/2018 |

OTHER PUBLICATIONS

Office Action dated Jan. 26, 2017, U.S. Appl. No. 14/953,372, 15 pages.
Written Opinion of ISA issued on PCT/CN2016/089249, dated Mar. 29, 2017.

* cited by examiner

LED POWER SUPPLY

CROSS-REFERENCE TO RELATED APPLICATIONS

This application is the National Stage of International PCT Application No. PCT/CN2016/089249, filed 7 Jul. 2016.

FIELD OF THE INVENTION

The present disclosure relates to LED photoelectric technologies, and more particularly relates to a LED power supply.

BACKGROUND OF THE INVENTION

An LED power supply is generally packaged in a metal housing. During the assembly and use, to meet the requirement of US UL safety certification, a junction box with metal housing is disposed outside the power module to protect the input/output wire. In practical use, this will increase the cost, and also increase the difficulty of structural design.

Conventionally, to solve the problem of high cost, the input/output wire of the LED power supply is completely packaged in a big iron box. However, this can increase the temperature of the use environment for power module, worse the working environment for power module, and shorten the supply life of LED power supply.

SUMMARY OF THE INVENTION

Accordingly, it is necessary to provide an LED power supply with a better power supply working environment.

An LED power supply includes: a first housing having a box structure with an opening end; a second housing disposed on the opening end of the first housing, partially covering the opening end; a partition plate disposed vertically on one end of the second housing, and the second housing, the partition plate, and part of the first housing cooperatively form an electric chamber; a cover body disposed on the opening end of first housing and covering the opening end together with the second housing, and the cover body, the partition plate and the remaining part of the first housing cooperatively form a wiring chamber; and a separating member disposed in the wiring chamber to divide the wiring chamber into a high voltage region and a low voltage region, and the high voltage region and the low voltage region are separated from each other via the separating member.

In the above-mentioned LED power supply, the electric chamber and the wiring chamber are independently formed by the first housing, the second housing, the partition plate and the cover body, such that electric parts such as power module are separated from the input/output wire, which can ensure that power module works in an independent environment, thus the temperature of working environment is reduced, the working environment is improved, the supply life of power module is enhanced, and the requirement of safety certification is satisfied. Meanwhile, in the above-mentioned LED power supply, the wiring chamber is divided into the high voltage region and the low voltage region by the separating member, which can ensure that the input and output wires work independently in the LED power supply, the regions are independent and interference-free from each other, and the stability of the LED power supply is enhanced.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. The accompanying drawings in the following description are only some embodiments of the present invention, and persons of ordinary skill in the art can derive other obvious variations from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are disposed so that this disclosure will be thorough and complete, and will fully convey the scope of the invention to those skilled in the art.

It will be understood that when an element is referred to as being "fixed" to another element, it can be directly coupled to the other element or intervening elements may be present. When an element is referred to as being "coupled" to another element, it can be directly coupled or intervening elements may also be present. It will be understood that, although the terms vertical, horizontal, left, right and similar expressions may be used herein to describe various elements, these terms are only used for representation and are not intended to limit the present disclosure to only one embodiment.

Unless otherwise defined, all terms (including technical and scientific terms) used herein have the same meaning as commonly understood by one of ordinary skill in the art to which this invention belongs. It will be further understood that the terms used herein the specification are for the purpose of describe detailed embodiments only, and are not intended to limit the present disclosure. The term "and/or" used herein the present disclosure comprises all and random combinations of one or more related item listed herein.

Figure 1:
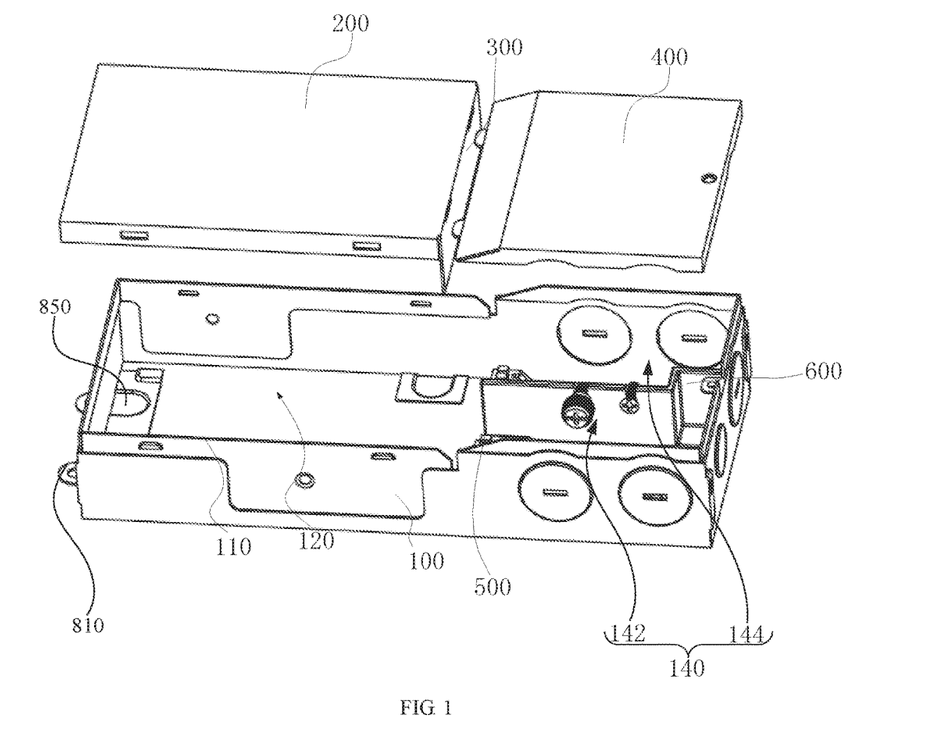
FIG. 1 is an exploded view of an LED power supply according to one embodiment.
Figure 2:
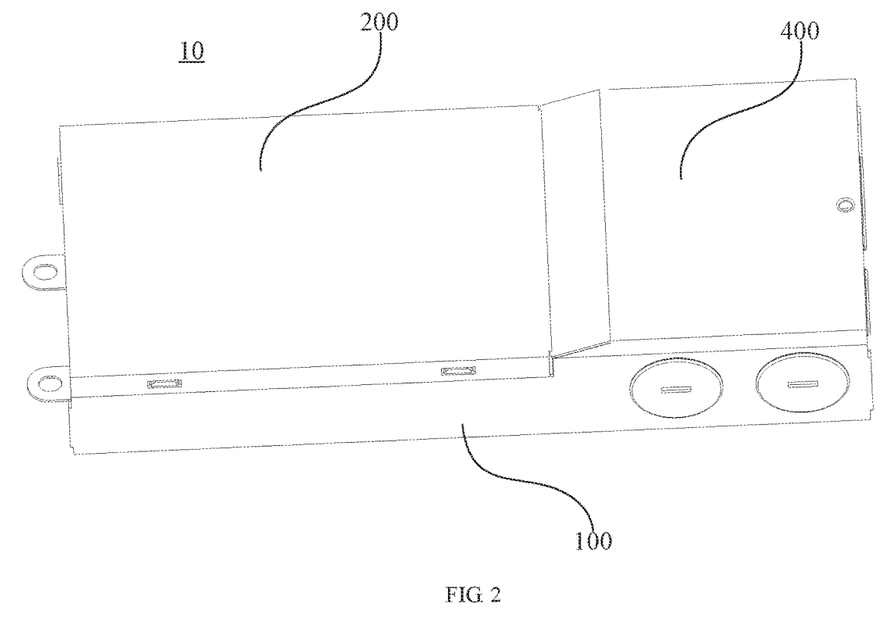
FIG. 2 shows the structure of the LED power supply shown in FIG. 1.

Referring to FIG. 1 and FIG. 2, an LED power supply 10 according to an embodiment is used to be electrically coupled to an LED light source and to drive the LED light source. The LED power source 10 includes a first housing 100, a second housing 200, a partition plate 300, a cover body 400, and a separating member 600.

Figure 3:
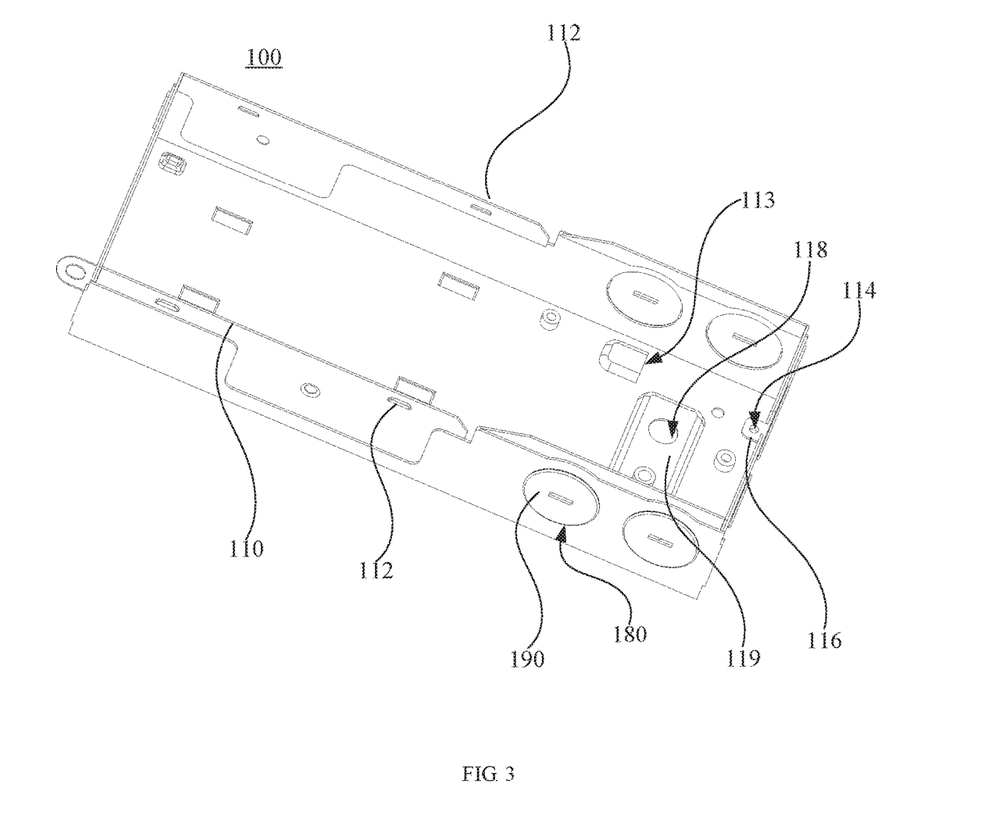
FIG. 3 shows the detailed structure of the first housing of the LED power supply shown in FIG. 1.

Referring to FIG. 3, the first housing 100 is of a hollow box structure with an opening end 110. The first housing 100 can be generally manufactured from a metal material, which is firm and has a certain heat dissipation capacity.

Figure 4:
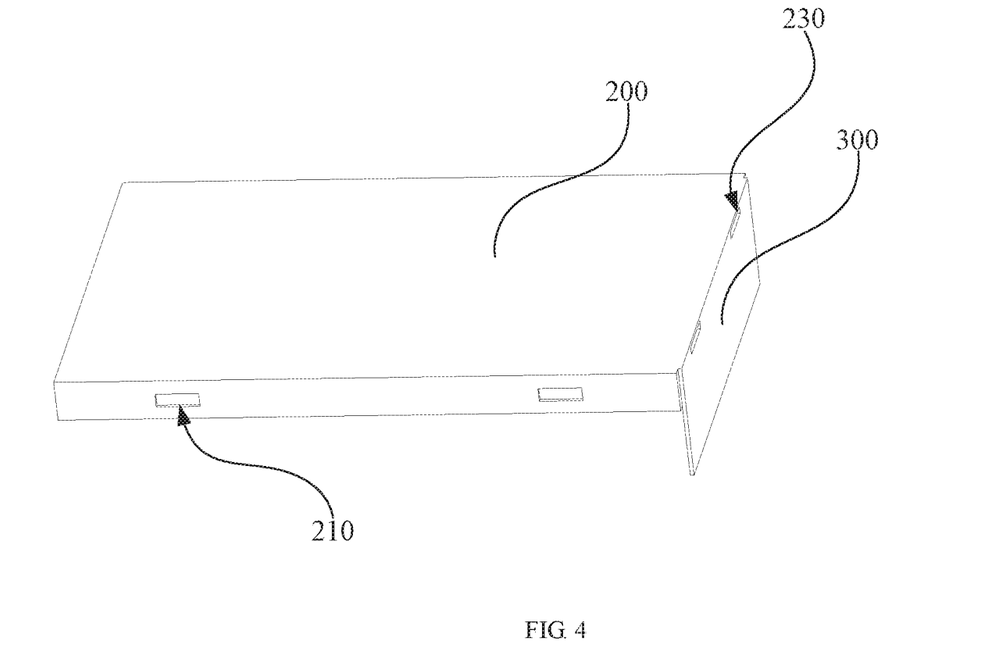
FIG. 4 shows the detailed structure of the second housing and the partition plate of the LED power supply shown in FIG. 1.

Referring to FIG. 4, the second housing 200 is disposed on the opening end 110 of first housing 100 and partially covers the opening end 110. The partition plate 300 is disposed vertically on one end of the second housing 200. The second housing 200, the partition plate 300, and part of the first housing 100 cooperatively form an electric chamber 120. The LED power supply 10 can further includes a power module (not shown), which is disposed in the electric chamber 120.

Specifically in this embodiment, the power module can in particular be a circuit board coupling with electronic components. Both the second housing 200 and the partition plate 300 can be produced from a metal material. The partition plate 300 can be integrally formed with the second housing 200. The bottom of the first housing 100 is also provided with a wire terminal (not shown) serving for being coupled to a ground wire.

Figure 5:
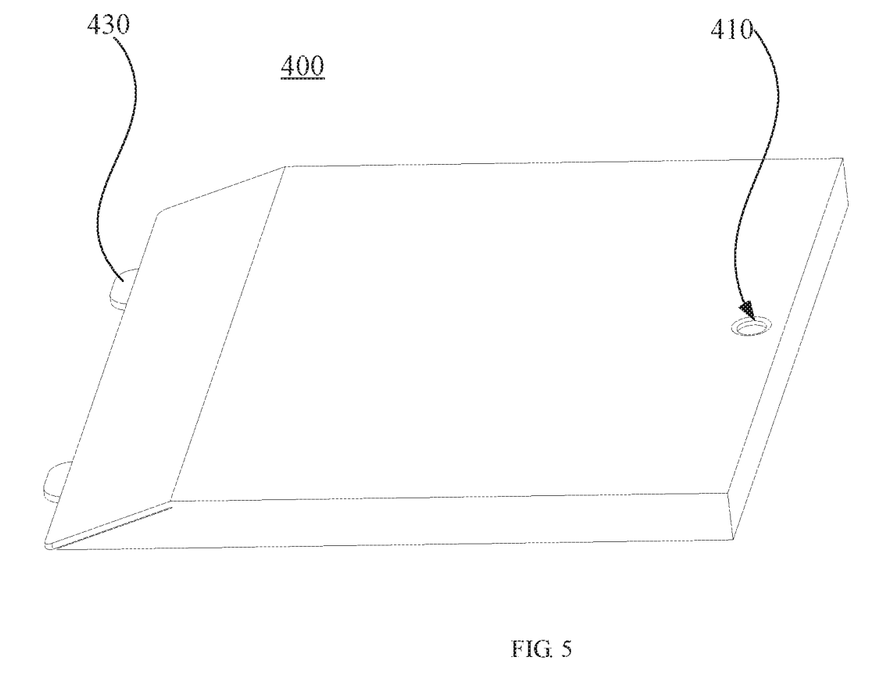
FIG. 5 shows the detailed structure of the cover body of the LED power supply shown in FIG. 1.

Referring to FIG. 5, the cover body 400 is disposed on the opening end 110 of the first housing 100, and covers the opening end 110 together with the second housing 200. The cover body 400, the partition plate 300, and the remaining part of the first housing 100 cooperatively form a wiring chamber 140. The LED power supply 10 also includes a wiring terminal 500. The wiring terminal 500 is received in the wiring chamber 140, and the power module is electrically coupled to the wiring terminal 500. The wiring terminal 500 is coupled to an external wire so that the power module is electrically coupled to the outside power via the wiring terminal 500.

Referring to FIG. 1, particularly in this embodiment, the separating member 600 is disposed in the wiring chamber 140. The separating member 600 divides the wiring chamber 140 into a high voltage region 142 and a low voltage region 144. The high voltage region 142 and the low voltage region 144 are separated from each other via the separating member 600, and the high voltage region 142 and the low voltage region 144 are independent from each other.

The LED power supply 10 further includes an input wire (not shown) and an output wire (not shown). The input wire is a high voltage wire, which is disposed in the high voltage region 142. The output wire is a low voltage wire, which is disposed in the low voltage region 144.

Figure 6:
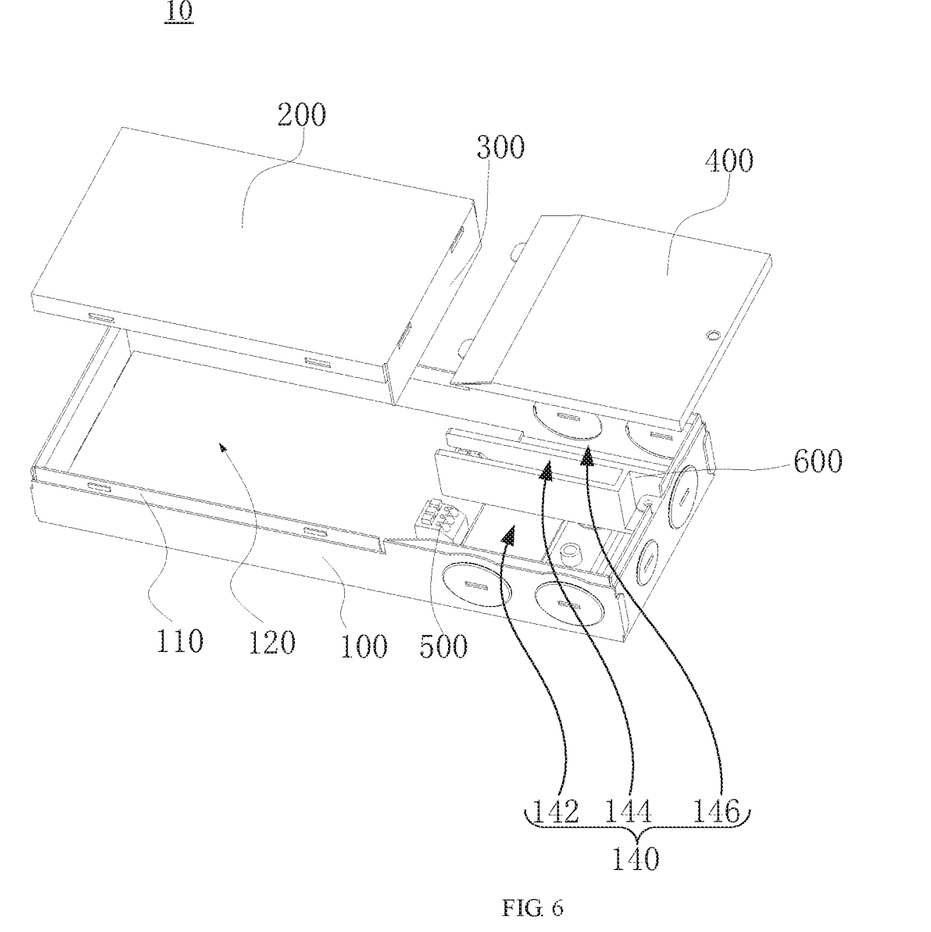
FIG. 6 is an exploded view of an LED power supply according to another embodiment.

Referring to FIG. 6, it should be noted that, the separating member 600 can be of an h-shape in order to divide a dimming region 146 in the low voltage region 144. Particularly, the low voltage region 144 is located between the high voltage 142 and the dimming region 146. The LED power 10 supply further includes an LED control wire (not shown) disposed in the dimming region 146.

Particularly in this embodiment, the separating member 600 can be a plastic component. It is to be understood that, in alternative embodiments, the separating member 600 can be made of other material and not limited to plastic material. The separating member 600 further defines a threaded hole (not shown) to allow a screw (not shown) to extend through. The screw can fasten the ground wire through the threaded hole, and fix the LED power supply 10 to a fixing cover of an LED lamp. The threaded hole in the separating member 600 allows the separating member 600 to function as a fixing bracket for the screws, so that the need for additional packaging materials and using tools for accessories such as screws is eliminated.

In the above-mentioned LED power supply 10, the electric chamber 120 and the wiring chamber 140 are independently formed by the first housing 100, the second housing 200, the separate 300, the cover body 400 and other elements, such that electric parts such as power module are separated from the input/output wire, which can ensure that the power module works in independent environment, thus the temperature of working environment is reduced, the working environment is improved, the supply life of power module is enhanced, and the requirement of safety certification is satisfied. Meanwhile, in the above-mentioned LED power supply 10, the wiring chamber 140 is divided into a high voltage region 142 and a low voltage region 144 by the separating member 600, which can ensure that the input and output wires work independently in the LED power supply 10, the regions are independent and interference-free from each other, and the stability of the LED power supply 10 is enhanced.

Meanwhile, the low voltage region 144 can separate the diming region 146 by the separating member 600, so as to ensure that the LED control wire can works independently without interference.

Furthermore, the above-mentioned power supply 10 is integrally designed to reduce the volume and also reduce the cost. During operation, the user opens the cover body 400 to couple the input/output wire, so that it can facilitate the use and assembly for end users.

Referring to FIG. 3 and FIG. 4, a peripheral edge of the opening end 110 is provided with a fastener 112. The second housing 200 defines a slot 210, the fastener 112 engages with the slot 210 so that second housing 200 is fixed to the opening end 110.

Particularly in this embodiment, a plurality of fasteners 112 are provided. The plurality of fasteners 112 is distributed on both side edges of the peripheral edge of the opening end 110. Correspondingly, the second housing 200 defines a plurality of slots 210, and fasteners 112 engage with the slots 210 engage, respectively. The plurality of fasteners 112 engages with slots 210 so that the second housing 200 can be firmly fixed to the opening end 110 and cannot be removed easily, so that the requirement of safety certification is satisfied.

Referring to FIG. 3 and FIG. 5 again, the opening end 110 defines a screw hole 114, and the cover body 400 defines a through hole 410. The LED power supply 10 further includes a threaded fastener (not shown). The threaded fastener extends through the bore 410 and is screwed with the screw hole 114 to fix the cover body 400 to the opening end 110.

Particularly in this embodiment, the first housing 100 has an elongated structure, and the screw hole 114 is defined on the end of the first housing 100 away from the second housing 200. The opening end 110 is provided with an inwardly extending lug 116, the screw hole 114 is disposed on the lug 116. One end of the cover body 400 is effectively fixed by the threaded fastener.

The second housing 200 is further provided with a notch 230 and the cover body further includes a protrusion 430 engaged in the notch 230. The other end of the cover body 400 is fixed by engaging the protrusion 430 in the notch 230.

During wiring, the thread fastener can be unscrewed, and the cover body 400 can be opened to perform the wiring operation.

Referring to FIG. 3 again, the first housing 100 further defines a wiring hole 180 in communication with the wiring chamber 140. A metal cover 190 can also be provided on the wiring hole 180. During wiring, the metal cover 190 can be knocked off and a wiring pipe can extend through the wiring hole 180 and be coupled to the wiring terminal 500 in the wiring chamber 140.

The first housing 100 further defines a first wire hole 118, the first wire hole 118 is in communication with the wiring chamber 140, and the separating member 600 defines a second wire hole (not shown) aligned with the first wire hole 118. Meanwhile, the separating member 600 also has the function of protecting wires through the hole, so that an additional protection rings can be omitted.

Figure 7:
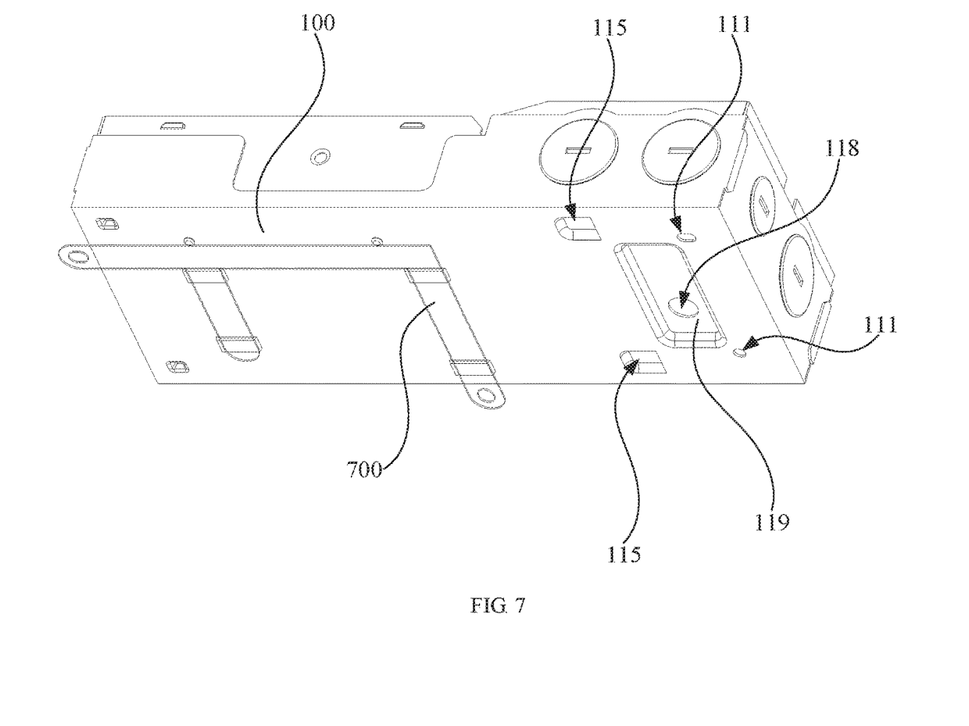
FIG. 7 shows the detailed structure from another angle of the first housing of the LED power supply shown in FIG. 1.

Referring to FIG. 3 and FIG. 7, a part of the wall of the first housing 100 protrudes towards the wiring chamber 140 so as to form a protruding wire passage 119. The wire passage 119 serves as a clearance for wiring.

The first housing 100 further defines a fixing hole 111. The fixing hole 111 can be connected to the LED lamp via a connect member (not shown). Particularly in this embodiment, the fixing hole 111 is a circular hole or an elongated hole.

The first housing 100 further defines a first hanging hole 113. The LED power supply 10 can be hung through the first hanging hole 113 so as to reduce the assembly work of assembling the LED power supply 10 to a lamp. Part of the wall of the first housing 100 that corresponds to the first hanging hole 113 protrudes towards the wiring chamber 140 so as to form a guiding groove 115 in communication with the first hanging hole 113, and an outer connect member (not shown) engages with the first hanging hole 113 through the guiding groove 115.

The above-mentioned LED power supply 10 further includes an assembly bracket 700. The assembly bracket 700 is fixed on a position of an outside of the first housing 100 that corresponds to the electric chamber 120. The assembly bracket 700 has an F-shaped structure. The LED power supply 10 can be fixed through the assembly bracket 700. The assembly bracket 700 is disposed on the outside of the first housing 100 to satisfy the safety certification requirement that the wall of LED power supply 10 corresponding to the electric chamber 120 cannot get penetrated.

Figure 8:
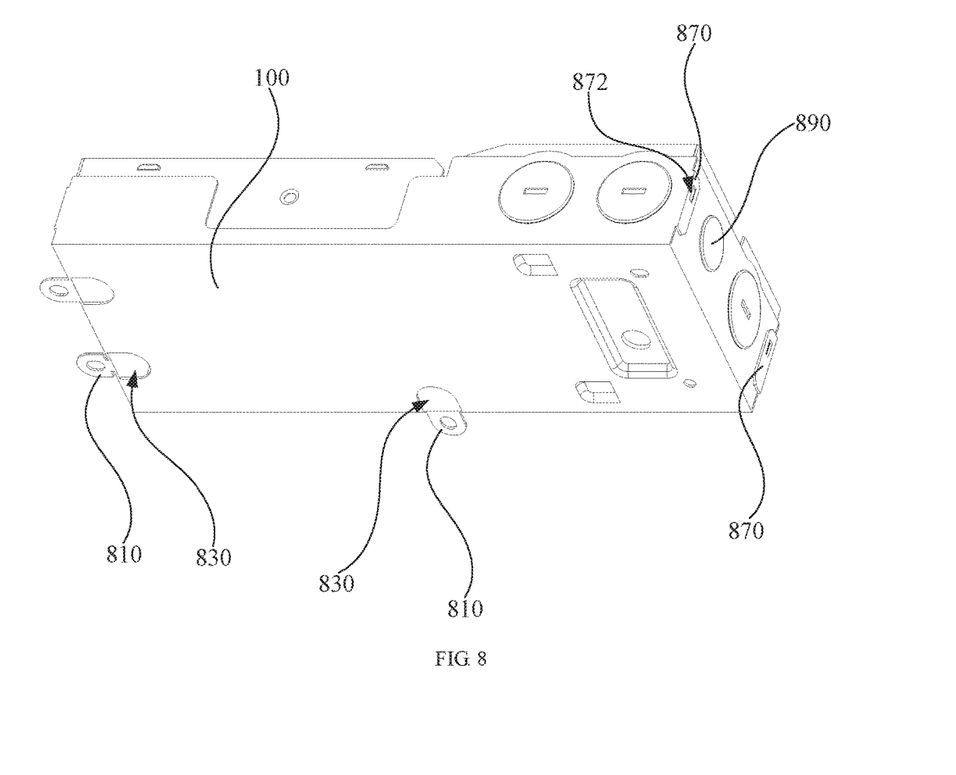
FIG. 8 shows the detail structure of the first housing in the LED power supply shown in FIG. 1 according to another embodiment.

Referring to FIG. 1 and FIG. 8, the side wall of the first housing 100 corresponding to the electric chamber 120 is provided with a plurality of the hook parts 810. The hook part 810 is formed by inverting a part of the side wall of the first housing 100, and a plurality of inverting holes 830 thus is defined on the first housing 100. The LED power supply 10 further includes a plurality of gaskets 850, and the plurality of gaskets 850 encloses the plurality of inverting holes 830, respectively.

The hook part 810 is formed by a process of punching out of the sheet material, eliminating the riveting process and ensuring the overall mechanical strength. Meanwhile, to satisfy the requirement that no hole is formed on the side wall of the electric chamber 120, the gaskets 850 are used to seal the holes.

The end face of the first housing 100 is further provided with a reinforcing members 870, and the reinforcing members 870 are disposed on the two sides of the end face. The reinforcing members 870 are disposed on the end face to enhance the mechanical strength of the entire LED power supply 10 so that it can resist the pulling force perpendicular to the extending direction of the LED power supply 10. In particular, the reinforcing member 870 further defines a second hanging hole 872 to facilitate the hanging of the LED power supply 10.

In addition, it should be noted that, the wiring hole 180 on the end face of the first housing 100 can also be sealed by a bump 890.

In the above-mentioned LED power supply 10, the electric chamber 120 and the wiring chamber 140 are independently formed by the first housing 100, the second housing 200, the separate 300, the cover body 400 and other elements, such that electric parts such as power module are separated from the input/output wire, which can ensure that the power module works in independent environment, thus the temperature of working environment is reduced, the working environment is improved, the supply life of power module is enhanced, and the requirement of safety certification is satisfied. Meanwhile, in the above-mentioned LED power supply 10, the wiring chamber 140 is divided into the high voltage region 140, the low voltage region 144, and the diming region 146 by the separating member 600, which can ensure that the input wire, the output wire, and the LED control wire for diming can work independently in the LED power supply 10, the regions are independent and interference-free from each other, and the stability of the LED power supply 10 is enhanced.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

The above-mentioned embodiments are merely specific implementations of the present disclosure, but are not intended to limit the protection scope of the present disclosure. It should be noted that any variation or replacement readily figured out by persons skilled in the art within the technical scope disclosed in the present disclosure shall all fall within the protection scope of the present disclosure. Therefore, the protection scope of the present disclosure shall be subject to the protection scope of the claims.

What is claimed is:

1. An LED power supply, comprising:
    a first housing having a box structure with an opening end;
    a second housing disposed on the opening end of the first housing and partially covering the opening end;
    a partition plate disposed vertically on an end of the second housing, wherein the second housing, the partition plate, and a part of the first housing cooperatively form an electric chamber;
    a cover body disposed on the opening end of first housing and covering the opening end together with the second housing, wherein the cover body, the partition plate and the remaining part of the first housing cooperatively form a wiring chamber;
    and a separating member disposed in the wiring chamber to divide the wiring chamber into a high voltage region and a low voltage region, wherein the high voltage region and the low voltage region are separated from each other via the separating member;
    wherein the separating member is of an h-shape or z-shape so as to divide a dimming region in the low voltage region, the LED power supply further comprises an LED control wire disposed in the dimming region;

further comprising an assembly bracket fixed on a position of an outside of the first housing corresponding to the electric chamber, wherein the assembly bracket has an F-shaped structure.

2. The LED power supply of claim 1, further comprising a power module and a wiring terminal, wherein the power module is received in the electric chamber, the wiring terminal is received in the wiring chamber, and the power module is electrically coupled to the wiring terminal;

the LED power supply further comprises an input wire and an output wire, the input wire is disposed in the high voltage region and the output wire is disposed in the low voltage region;

a part of a wall of the first housing protrudes towards the wiring chamber so as to form a protruding wire passage.

3. The LED power supply of claim 1, wherein the first housing further defines a first wire hole in communication with the wiring chamber, and the separating member defines the second wire hole aligned with the first wire hole.

4. The LED power supply of claim 1, wherein the first housing further defines a fixing hole, the fixing hole is capable of being connected to an LED lamp via a connect member; the fixing hole is a circular hole or an elongated hole.

5. The LED power supply of claim 1, wherein the first housing further defines a first hanging hole;

a part of a wall of the first housing corresponding to the first hanging hole protrudes towards the wiring chamber so as to form a guiding groove in communication with the first hanging hole.

6. The LED power supply of claim 1, wherein the separating member further defines a threaded hole to allow a screw to extend through.

7. The LED power supply of claim 1, wherein a side wall of the first housing corresponding to the electric chamber is provided with a plurality of the hook parts; the hook part is formed by inverting a part of the side wall of the first housing, and a plurality of inverting holes is thus defined on the first housing; the LED power supply further comprises a plurality of gaskets, and the plurality of gaskets seals the plurality of inverting holes, respectively.

8. The LED power supply of claim 1, wherein an end face of the first housing is further provided with reinforcing members disposed on both sides of the end face; and the reinforcing member further defines a second hanging hole.

* * * * *